US011516933B2

(12) United States Patent
Niizuma

(10) Patent No.: US 11,516,933 B2
(45) Date of Patent: Nov. 29, 2022

(54) MOUNTING STRUCTURE OF LEG MEMBER, AND ELECTRONIC APPARATUS

(71) Applicant: TEAC Corporation, Tokyo (JP)

(72) Inventor: Tomoyuki Niizuma, Tokyo (JP)

(73) Assignee: TEAC Corporation, Tokyo (JP)

( * ) Notice: Subject to any disclaimer, the term of this patent is extended or adjusted under 35 U.S.C. 154(b) by 0 days.

(21) Appl. No.: 17/126,186

(22) Filed: Dec. 18, 2020

(65) Prior Publication Data
US 2021/0204431 A1 Jul. 1, 2021

(30) Foreign Application Priority Data

Dec. 26, 2019 (JP) .............................. JP2019-236266

(51) Int. Cl.
H05K 5/02 (2006.01)
G11B 33/08 (2006.01)

(52) U.S. Cl.
CPC ........... H05K 5/0234 (2013.01); G11B 33/08 (2013.01)

(58) Field of Classification Search
None
See application file for complete search history.

(56) References Cited

U.S. PATENT DOCUMENTS

| 4,877,364 | A | * | 10/1989 | Sorrentino | ............ | F16B 5/0275 411/337 |
| 5,007,607 | A | * | 4/1991 | Kim | ...................... | A47B 81/06 248/188.9 |
| 6,155,530 | A | * | 12/2000 | Borgen | ................... | H04R 1/026 248/638 |
| 7,048,247 | B2 | * | 5/2006 | Tanishima | ............... | F16M 7/00 248/188.8 |
| 8,002,228 | B2 | * | 8/2011 | Wang | ...................... | G06F 1/181 248/349.1 |
| 2003/0218957 | A1 | | 11/2003 | Tanishima | | |
| 2010/0237223 | A1 | * | 9/2010 | Kao | ..................... | H05K 5/0234 248/688 |
| 2011/0303688 | A1 | * | 12/2011 | Chen | .................... | H05K 5/0234 220/694 |

FOREIGN PATENT DOCUMENTS

CN 203789881 U 8/2014
JP S64-5295 U 1/1989
(Continued)

OTHER PUBLICATIONS

Chinese Office Action, dated Jan. 6, 2022, for Chinese Application No. 202011524914.X, 14 pages, (with English translation).

Primary Examiner — James Wu
Assistant Examiner — Christopher L Augustin
(74) Attorney, Agent, or Firm — Seed IP Law Group LLP

(57) ABSTRACT

A mounting structure of a leg member includes a bottom plate constituting a housing and a leg member. A first female screw hole is formed on the bottom plate. The leg member includes a leg member main body and a support column. The support column has a first male screw member and a shaft member. In case the first male screw member is screwed into the first female screw hole and passes from a bottom surface side to a top surface side of the bottom plate, the shaft member is loosely fitted in the first female screw hole and the first male screw member is locked to the top surface.

10 Claims, 17 Drawing Sheets

(56) References Cited

FOREIGN PATENT DOCUMENTS

| | | | |
|---|---|---|---|
| JP | H05-8697 Y2 | | 3/1993 |
| JP | H07-302981 A | | 11/1995 |
| KR | 200154834 Y1 | * | 8/1999 |
| KR | 200302238 Y1 | * | 1/2003 |
| KR | 101649092 B1 | * | 8/2016 |

* cited by examiner

MOUNTING STRUCTURE OF LEG MEMBER, AND ELECTRONIC APPARATUS

CROSS-REFERENCE TO RELATED APPLICATION

This application claims priority under 35 USC 119 from Japanese Patent Application No. 2019-236266, filed 26 Dec. 2019, the disclosure of which is incorporated by reference herein.

BACKGROUND OF THE INVENTION

1. Field of the Invention

The present invention relates to a mounting structure of a leg member, and an electronic apparatus.

2. Description of the Related Art

Electronic apparatuses such as CD (Compact Disc) players that reproduce audio data receive internal vibration caused by motors that rotate discs and cooling fans, and external vibration from the floor surface on which the electronic apparatus is installed. Such internal vibration and external vibration cause deterioration of sound quality when reproducing audio data in the electronic apparatus.

In conventional electronic apparatuses, a leg member located between a housing of the electronic apparatus and the floor surface is fixed to the housing by screwing or the like. Therefore, the leg member transmits the external vibration from the floor surface to the housing. The vibration transmitted to the housing affects operation of internal parts, such as an optical pickup provided in a CD player or the like. That is, when the optical pickup reads a minute signal, noise caused by vibration is mixed in, and the sound quality of the reproduced audio data is deteriorated.

Therefore, in order to improve the sound quality of the electronic apparatus, it is known to use a leg member called an insulator that is interposed between the housing and the floor surface. There are various types of insulators. For example, there are a floating type insulator (Japanese unexamined utility model application publication No. S64-5295) that blocks vibration using an elastic material such as rubber or resin, and a hard insulator (Japanese examined utility model application publication No. H5-8697) that absorbs vibration using a hard material such as metal and prevents the vibration from being transmitted to the inside of housing. Alternatively, a spike type insulator (Japanese unexamined patent application publication No. H7-302981) is known, which is formed in a conical shape, a triangular pyramid shape, a hemispherical shape, or the like, and suppresses vibration transmitted to housing by reducing the contact area with housing.

However, the insulators described in Japanese unexamined utility model application publication No. S64-5295 and Japanese examined utility model application publication No. H5-8697 are fixed to the housing by screwing or the like. In case the insulator is fixed to the housing, it is easy to transmit the external vibration from the floor surface to the housing, and it is insufficient to prevent the influence of the vibration. On the other hand, the insulator described in Japanese unexamined patent application publication No. H7-302981 is used without being fixed to housing. When installing an electronic apparatus with a non-fixed insulator, the user must hold the housing floating from the floor surface and insert the insulator between the housing and the floor surface. As it is difficult to keep a heavy electronic apparatus floating from the floor surface, the installation work may take time and effort.

In addition, as a structure that integrates the leg member without fixing to the housing, it may be a structure that a through hole is formed in the bottom plate of the housing, and a support column provided integrally with the leg member is loosely fitted into the through hole of the bottom plate. In such a structure, in order to prevent the support column loosely fitted in the through hole from coming off, it is common to attach a retaining member to the tip end portion of the support column. However, in this case, as the retaining member such as an E-ring or a snap pin to be attached to the tip end portion of the support column is required, the degree of freedom is reduced in arranging components inside the housing. In addition, it is necessary to machine a groove or a hole for mounting the retaining member in the support column, which increases the manufacturing process.

SUMMARY OF THE INVENTION

An object of the invention is to provide a mounting structure of a leg member that can be integrally attached to a housing while suppressing vibration that affects the sound quality from being transmitted to inside of the housing, and an electronic apparatus having a leg member with this mounting structure.

In order to solve the above problems, a mounting structure of a leg member of the present invention is to be attached to a housing of an electronic apparatus. The structure includes a bottom plate, which has a plurality of first female screw holes, and the leg member. The leg member includes a leg member main body and a support column provided integrally with the leg member main body. The support column includes a first male screw member and a shaft member. In case the first male screw member is screwed into the first female screw hole and passes from one surface side to the other surface side of the bottom plate, the shaft member is loosely fitted into the first female screw hole, and the first male screw member is locked to the other surface of the bottom plate. The bottom plate constitutes the housing. The leg member main body is placed between the bottom plate and an installation surface of the electronic apparatus. The first male screw member is located at the tip end of the support column and screwed into the first female screw hole. The shaft member connects the leg member main body and the first male screw member. The shaft member is formed so that its outer diameter is smaller than the inner diameter of the first female screw hole and its shaft length is equal to or larger than the thickness of the bottom plate, and is loosely fitted with the first female screw hole.

Preferably, the leg member main body includes a first support member connected to the shaft member and a second support member located on the base end side of the first support member, the first support member has a spike member that protrudes from the base end portion of the first support member and is one step convex with respect to its surroundings, the second support member has a spike receiving member that is on the tip surface of the second support member and is one step concave with respect to its surroundings, and the second support member supports load from the first support member, the support column, and the housing by contacting the spike receiving member with the spike member.

Preferably, the first support member has a plurality of second female screw holes, the leg member main body includes a plurality of screw members to be screwed into the second female screw holes, the second support member has a flange member that projects outward from the periphery of the spike receiving member, and the first support member and the second support member are prevented from being separated from each other, by locking the flange member with the screw members screwed into the second female screw holes.

Preferably, the leg member main body has a projecting pin protruding from a tip surface facing the bottom plate, and the leg member is restricted from rotating around the shaft member, by loosely fitting the projection pin with a through hole formed in the bottom plate.

Preferably, the projecting pin is at least one of the plurality of screw members, and the tip part of the screw member, which is screwed with the first support member and protrudes from the tip end of the leg member main body, is loosely fitted in the through hole as the projecting pin.

Preferably, the leg member main body has a housing supporting member protruding from a tip surface facing the bottom plate, and the housing supporting member comes into contact with the bottom plate to support load from the housing.

Preferably, the spike member has any one of a conical shape, a triangular pyramid shape, and a hemispherical shape, and the spike receiving member is a notch cut out from the tip surface of the second support member according to the shape of the spike member.

The electronic apparatus of the present invention includes a leg member attached by the above mounting structure of the leg member.

Accordingly, the invention can provide a mounting structure of a leg member that can be integrally attached to a housing while suppressing vibration that affects the sound quality from being transmitted to inside of the housing, and an electronic apparatus having a leg member with this mounting structure.

DESCRIPTION OF THE PREFERRED EMBODIMENTS

Figure 1:
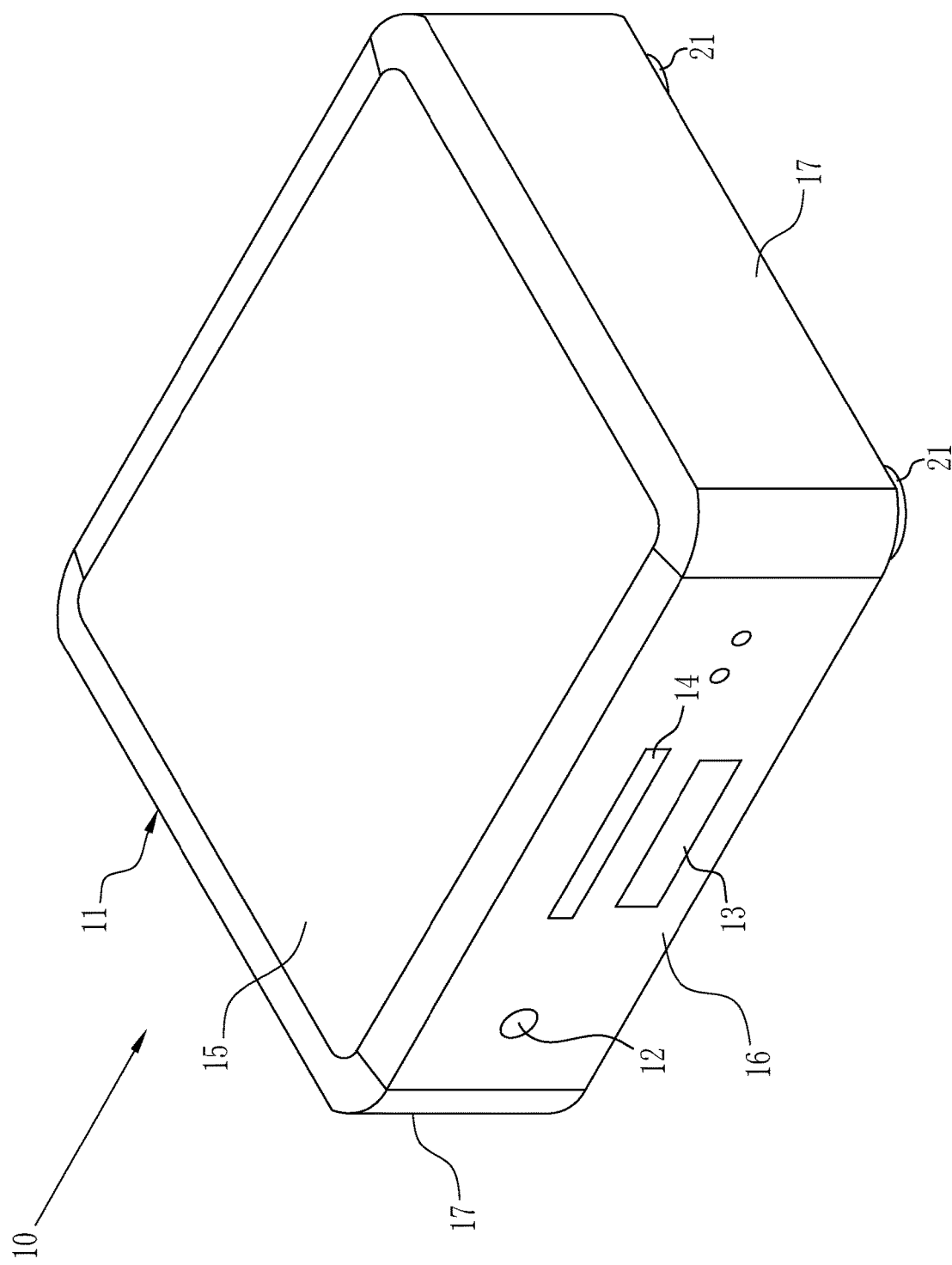
FIG. 1 is a perspective view showing an appearance of an electronic apparatus.

In FIG. 1, an electronic apparatus 10 is a kind of high-end audio equipment, and is a digital audio data reproduction equipment, for example, a CD player. The electronic apparatus 10 includes a box-shaped housing 11 in which various parts are housed, and four leg members 21. A power button 12, an indicator 13, and a medium insertion port 14 are arranged on the front surface of the housing 11, and various connection connectors (not shown) such as a power cord connector are arranged on the back surface.

The housing 11 is composed of a top plate 15, a front plate 16, both side plates 17, a back plate (not shown), a bottom plate 18 (see FIG. 2), and the like, and has a substantially rectangular parallelepiped appearance.

Figure 2:
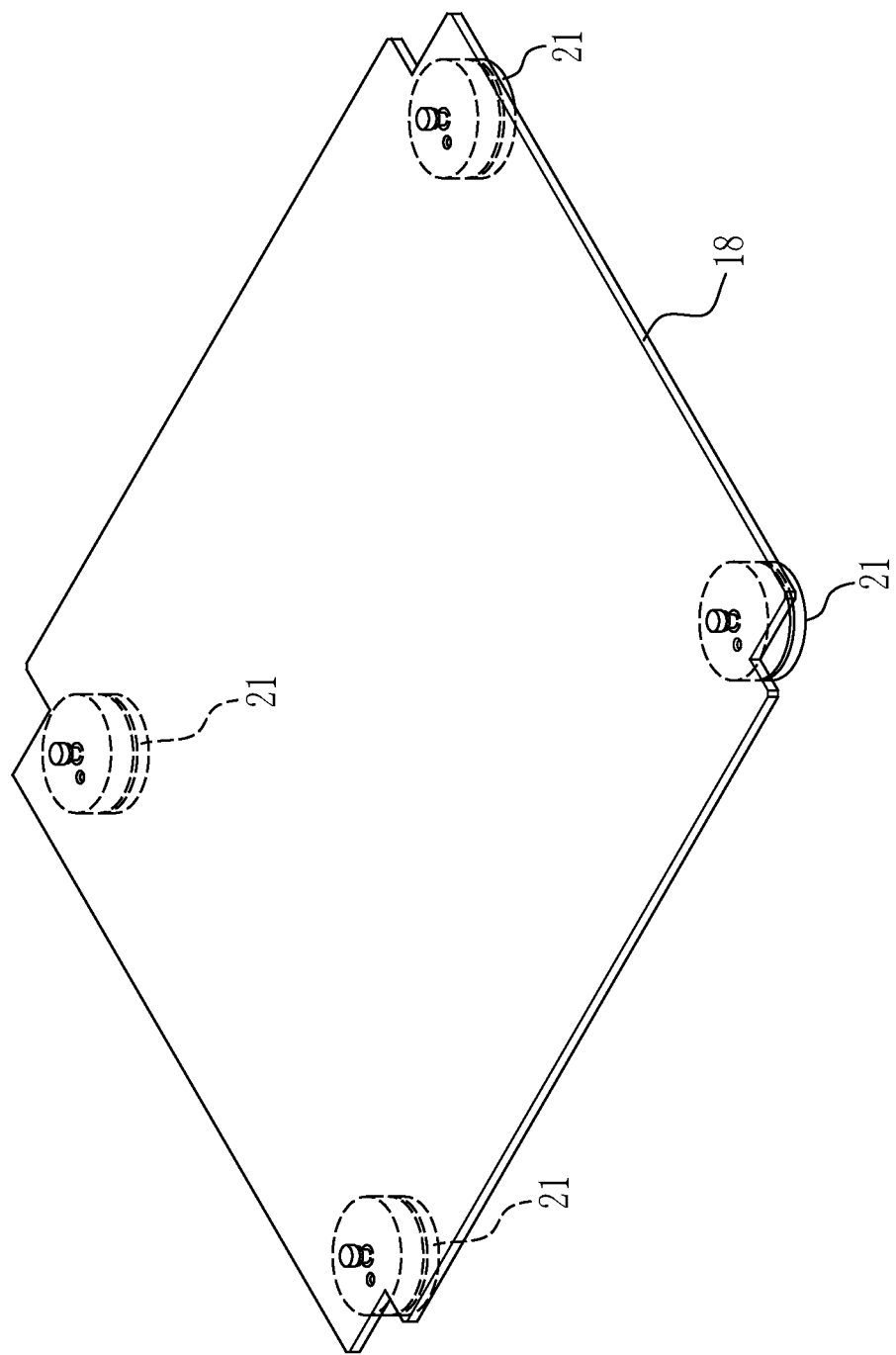
FIG. 2 is a perspective view showing inside of the electronic apparatus in a state where a top plate, a front plate, both side plates, a back plate and the like of a housing are removed.

FIG. 2 is a view showing a state in which the top plate 15, the front plate 16, the both side plates 17, the back plate and the like constituting the housing 11 are removed to expose the bottom plate 18. Note that in FIG. 2, description of parts housed inside the housing 11 is omitted. The bottom plate 18 is a thin plate having a substantially rectangular shape, and is made of a hard material such as metal. The leg members 21 for installing the electronic apparatus 10 on an installation surface are attached to the four corners of the bottom plate 18.

Figure 3:
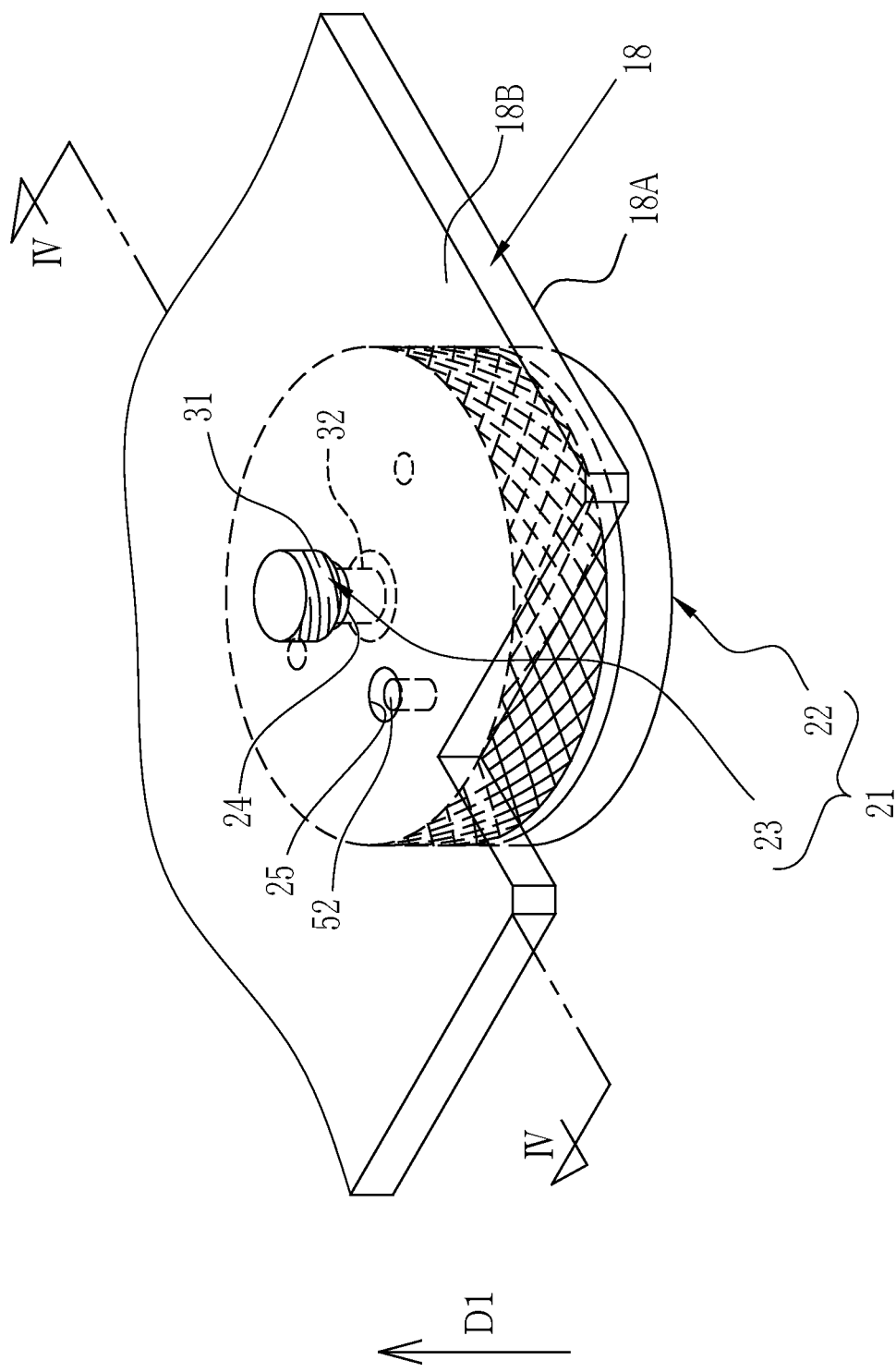
FIG. 3 is a perspective view showing a structure around a leg member of the electronic apparatus.

As shown in FIG. 3, the leg member 21 includes a leg member main body 22 and a support column 23. The leg member main body 22 and the support column 23 are made of a hard material such as metal. The leg member main body 22 is formed in a substantially disc shape or a substantially columnar shape, and is arranged between the bottom plate 18 and an installation surface S (see FIG. 4) of the electronic apparatus 10. The support column 23 is provided integrally with the leg member main body 22.

Four first female screw holes 24 (see FIG. 5) are formed on the bottom plate 18. The first female screw holes 24 are located near the four corners of the bottom plate 18. The leg member 21 is integrated with the housing 11 by attaching the support column 23 to the first female screw hole 24 of the bottom plate 18. Through holes 25 are formed in the vicinity of the respective first female screw holes 24. The first female screw hole 24 and the through hole 25 are arranged at a predetermined interval.

Figure 4:
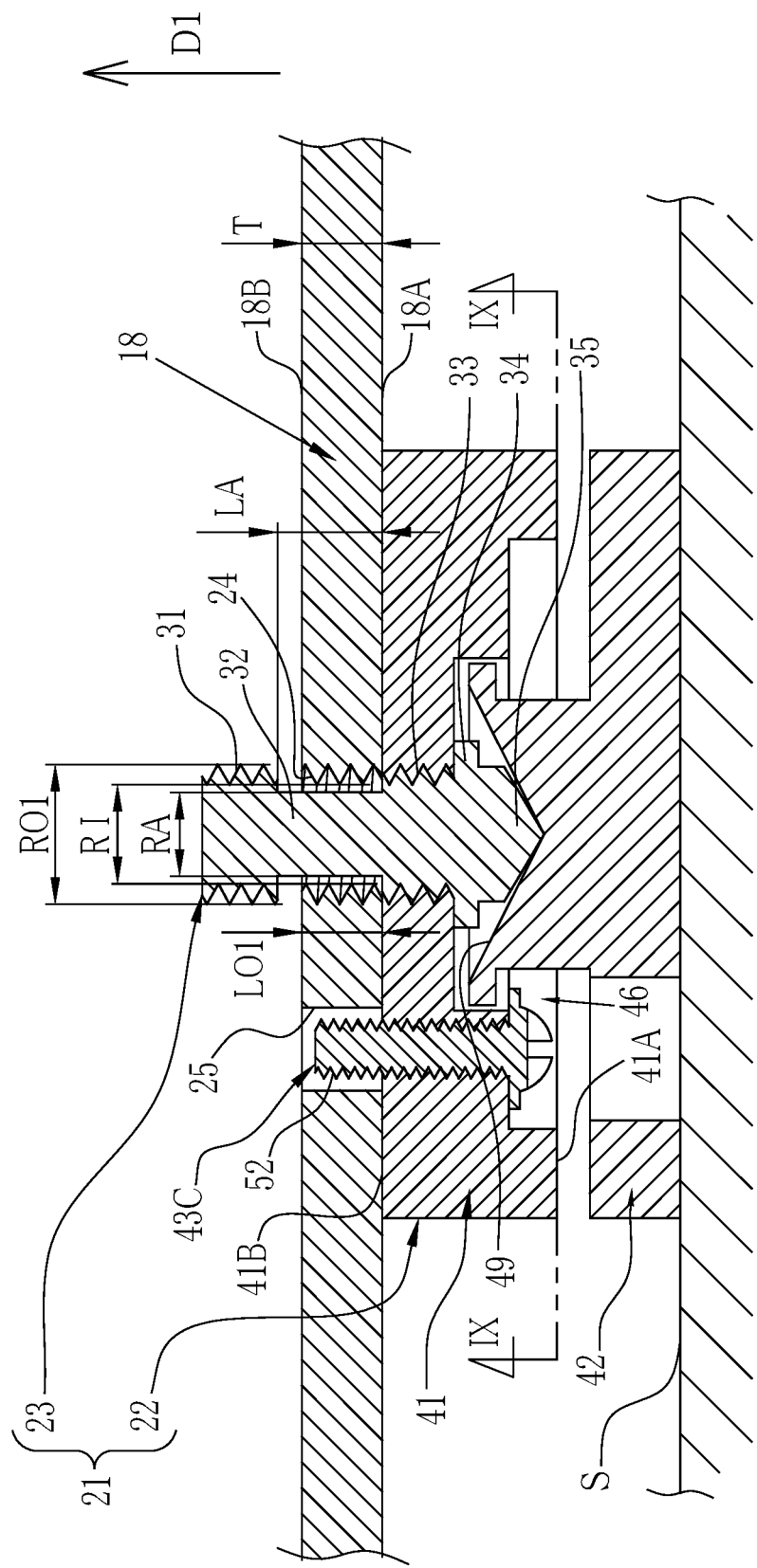
FIG. 4 is a cross-sectional view taken along the line IV-IV of FIG. 3.

As shown in FIG. 4, the support column 23 is configured by integrally forming a first male screw member 31, a shaft member 32, a second male screw member 33, a disc member 34, and a spike member 35 in this order from the tip end side to the base end side. In the following, the tip end, the tip end portion and the tip end side in direction D1 in which the first male screw member 31 is screwed into the first female screw hole 24 are simply referred to as "the tip end", "the tip end portion" and "the tip end side". The base end, the base end portion and the base end side in the direction D1 are simply referred to as "the base end", "the base end portion" and "the base end side". The direction D1 is parallel to the vertical direction of the housing 11.

Figure 5:
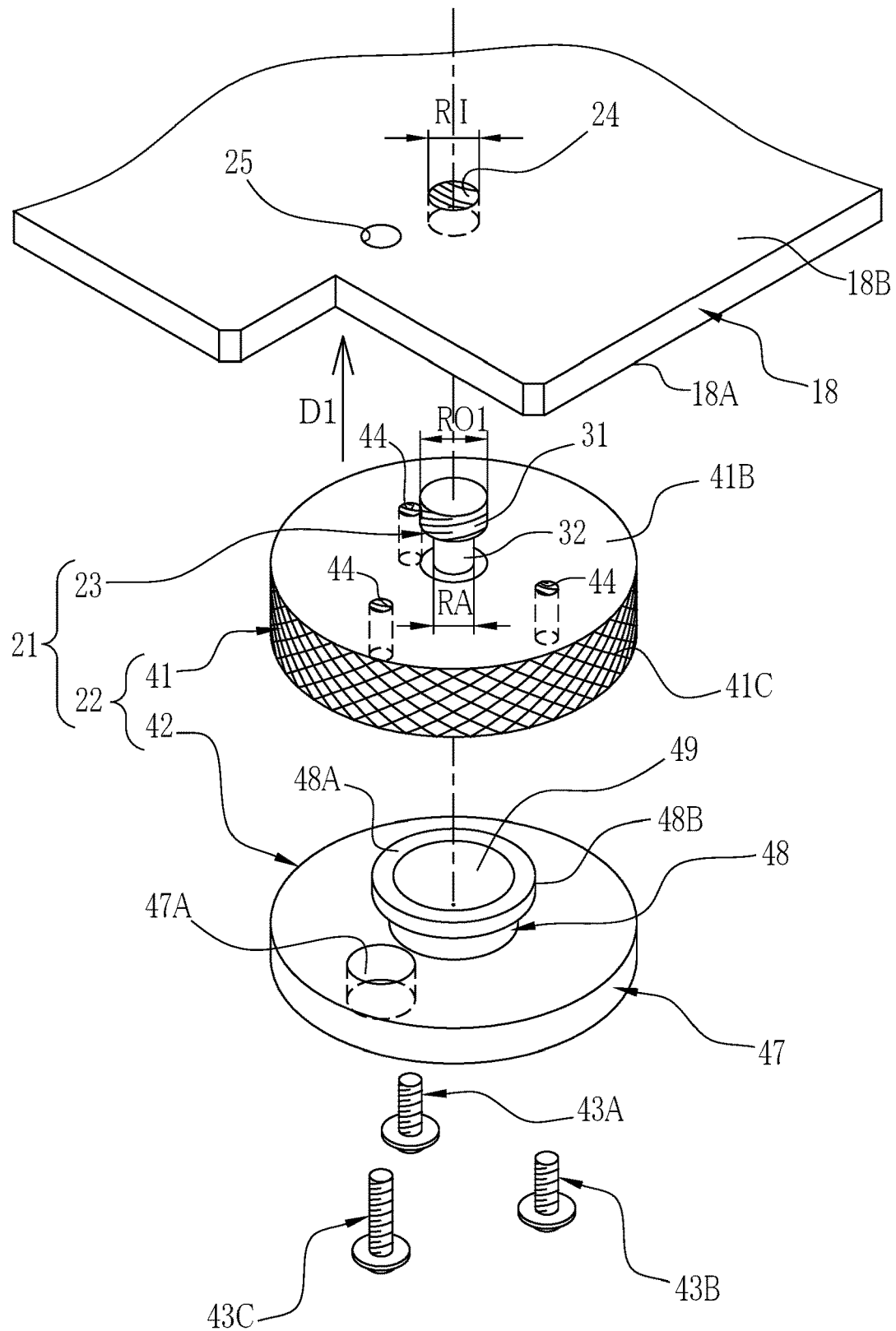
FIG. 5 is an exploded perspective view of the leg member.

The leg member main body 22 includes a first support member 41, a second support member 42 located on the base end side of the first support member 41, and three screw members 43A to 43C (see FIG. 5). The screw members 43A to 43C are used to prevent the first support member 41 and the second support member 42 from separating from each other.

The first male screw member 31 is located at the tip end of the support column 23 and is screwed into the first female screw hole 24. That is, the first male screw member 31 has the same pitch as the first female screw hole 24, and has substantially the same screw diameter as the first female screw hole 24. In this case, substantially the same screw diameter means that the screw diameter of the first male screw member 31 is smaller than that of the first female screw hole 24, with a dimensional difference such that the first male screw member 31 and the first female screw hole 24 do not fix with each other.

The shaft member 32 is jointly provided with the first female screw hole 24, and connects the leg member main body 22 and the first male screw member 31 by connecting the support column 23 and the leg member main body 22 as described later. The shaft member 32 is formed so that its outer diameter RA is smaller than the inner diameter RI of the first female screw hole 24 and its shaft length LA is equal to or larger than the thickness T of the bottom plate 18. The thickness T of the bottom plate 18 is equal to the length LO1 in the axis direction of the first female screw hole 24. Therefore, when the shaft member 32 is inserted inside the first female screw hole 24, the shaft member 32 is loosely fitted with the first female screw hole 24. The shaft length LA indicates the length from the tip end to the base end of the shaft member 32.

As shown in FIG. 5, when the first male screw member 31 is screwed into the first female screw hole 24 along the direction D1 and passes from a bottom surface 18A side (one surface side) to a top surface 18B side (the other surface side) of the bottom plate 18, the shaft member 32 is inserted inside the first female screw hole 24. That is, the shaft member 32 is in the state of being loosely fitted in the first female screw hole 24 (the state shown in FIGS. 3 and 4).

As described above, since the screw diameters of the first male screw member 31 and the first female screw hole 24 are substantially the same, the outer diameter RO1 of the first male screw member 31 is larger than the inner diameter RI of the first female screw hole 24. Accordingly, in the state shown in FIGS. 3 and 4, the first male screw member 31 is locked to the top surface 18B of the bottom plate 18. Therefore, the position of the shaft member 32 in the direction D1 is restricted, and the shaft member 32 is prevented from leaving the first female screw hole 24 to the base end side.

Figure 6:
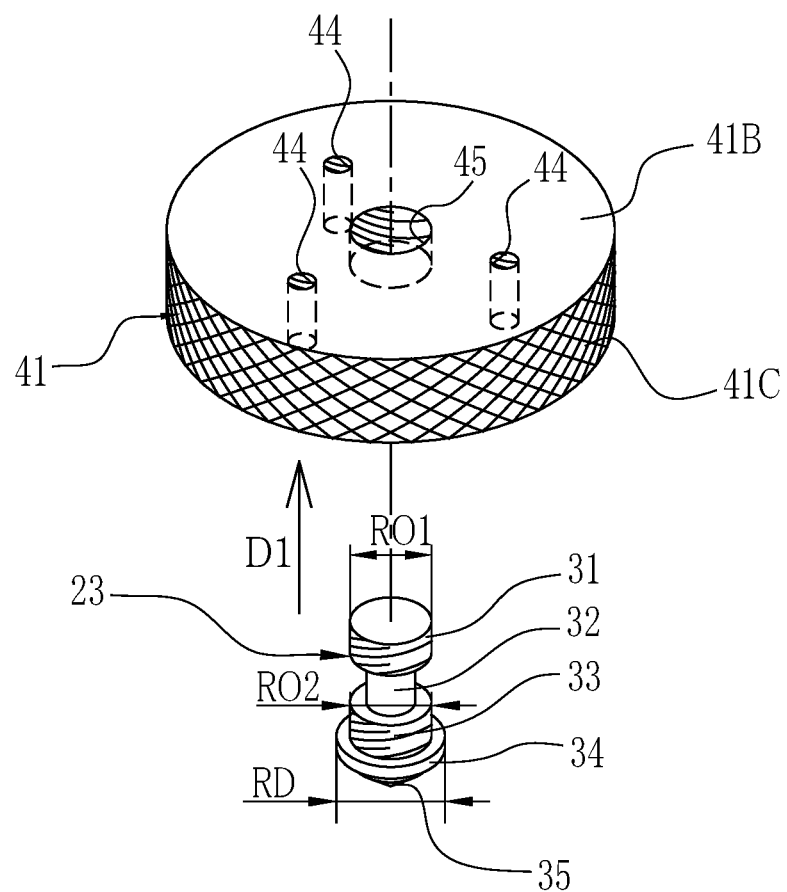
FIG. 6 is a perspective view of a support column and a first support member.

As shown in FIG. 6, the support column 23 is coupled to the first support member 41 by screwing the second male screw member 33 with a third female screw hole 45 described later. The disc member 34 and the spike member 35 are exposed from the base end side of the first support member 41 by screwing the second male screw member 33 with the third female screw hole 45. Further, the outer diameter RD of the disc member 34 is formed to be larger than the outer diameter RO2 of the second male screw member 33.

Figure 7A:
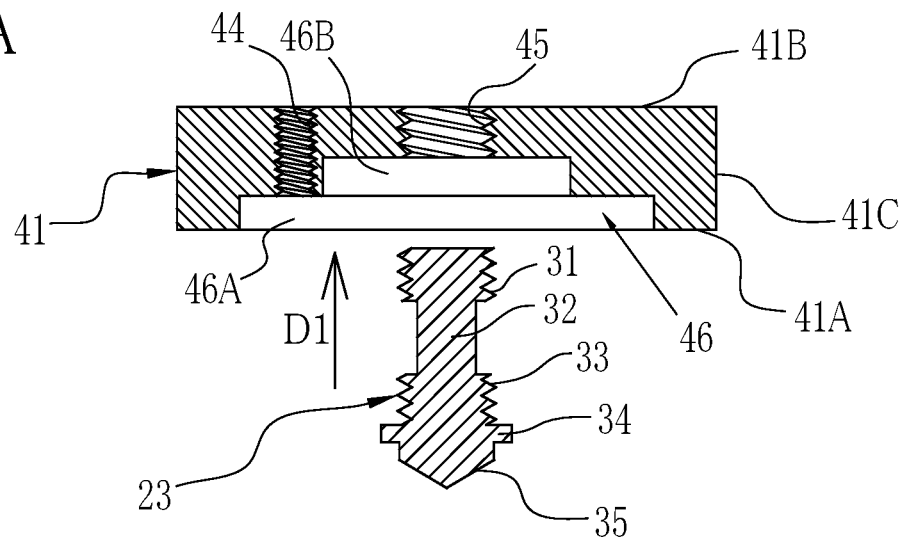
FIGS. 7A-7C are explanatory diagrams illustrating a process of connecting the first support member and the support column.
Figure 7B:
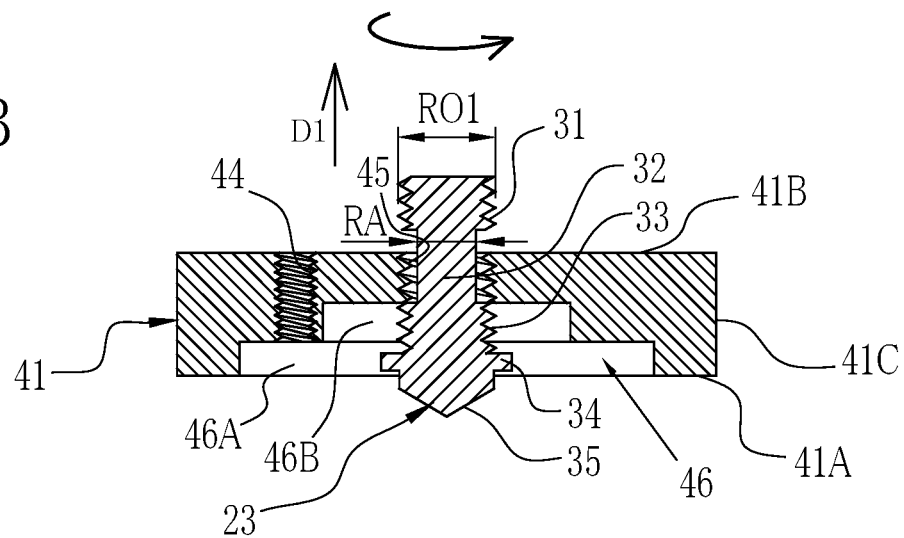
Figure 7C:
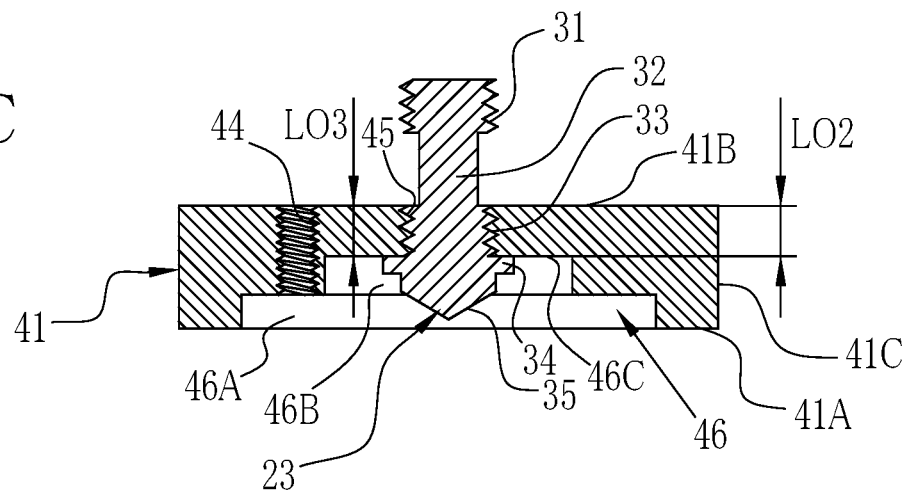

As shown in FIGS. 7A to 7C, the first support member 41 is formed with second female screw holes 44, the third female screw hole 45, and a notch 46. The notch 46 is cut out from a bottom surface 41A, which is the surface of the base end side of the first support member 41, in a substantially disc shape coaxial with the outer shape of the first support member 41. The notch 46 has a large-diameter part 46A and a small-diameter part 46B. The large-diameter part 46A located on the base end side has a larger inner diameter than the small-diameter part 46B located on the tip end side.

The outer shape of the first support member 41 is formed in a substantially disc shape, and the third female screw hole 45 is located at the center thereof. The third female screw hole 45 is screwed with the second male screw member 33 as described above. That is, the second male screw member 33 has the same pitch as the third female screw hole 45, and has substantially the same screw diameter as the third female screw hole 45. In this case, substantially the same screw diameter means that the screw diameter of the second male screw member 33 is substantially equal to that of the third female screw hole 45, with a dimensional difference such that the second male screw member 33 and the third female screw hole 45 can be fixed with each other. Further, the length LO2 in the axis direction of the second male screw member 33 is equal to or less than the length LO3 in the axis direction of the third female screw hole 45.

On the other hand, the third female screw hole 45 has a size that the first male screw member 31 can be screwed into, that is, they have the same dimensional relationship as between the first male screw member 31 and the first female screw hole 24. The first male screw member 31, the shaft member 32, the second male screw member 33, the disc member 34, and the spike member 35 are formed coaxially. The third female screw hole 45 penetrates the first support member 41 from a top surface 41B, which is the tip end side surface of the first support member 41, to a position communicating with the notch 46. Accordingly, when the second male screw member 33 is screwed into the third female screw hole 45, the disc member 34 and the spike member 35 are exposed from the inside of the notch 46.

In the step of connecting the first support member 41 and the support column 23, first, as shown in FIG. 7A, when the first male screw member 31 is screwed into the third female screw hole 45 from the base end side of the first support member 41, the first male screw member 31 passes through the third female screw hole 45. Further, since the outer diameter RA of the shaft member 32 is smaller than the outer diameter RO1 of the first male screw member 31, as shown in FIG. 7B, the shaft member 32 passes through the third female screw hole 45 so that the second male screw member 33 can be screwed into the third female screw hole 45. As shown in FIG. 7C, the second male screw member 33 is screwed into the third female screw hole 45 until the disc member 34 abuts on an upper end 46C of the notch 46. As a result, the support column 23 and the first support member 41 are integrated.

Further, since the length LO2 in the axis direction of the second male screw member 33 has a dimension equal to or less than the length LO3 in the axis direction of the third female screw hole 45, the second male screw member 33 is completely hidden inside the third female screw hole 45. That is, the second male screw member 33 does not protrude from the top surface 41B of the first support member 41, and the base end of the shaft member 32 is located on the same surface as the top surface 41B of the first support member 41, or on the base end side from the top surface 41B.

Further, an outer peripheral surface 41C of the first support member 41 is knurled as a non-slip processing. As a result, when the first support member 41 is rotated, the fingers of the operator or the like are easily caught.

As described above, the spike member 35 is located at the base end portion of the first support member 41 by combining the first support member 41 and the support column 23, and becomes one step convex with respect to the surroundings. In this embodiment, the spike member 35 is formed in a conical shape protruding from the disc member 34. The spike member 35 comes into contact with a spike receiving member 49, which will be described later, formed on the second support member 42.

The second female screw holes 44 are formed at positions corresponding to the apexes of an equilateral triangle centered on the third female screw hole 45 (see FIG. 6). In the state where the first support member 41 and the support column 23 are combined, the second female screw holes 44 are arranged around the support column 23. The second female screw hole 44 penetrates from the top surface 41B of the first support member 41 to a position communicating with the large-diameter part 46A of the notch 46. The second female screw holes 44 are screwed with the screw members 43A to 43C. The top surface 41B is the tip surface of the leg member main body 22 facing the bottom plate 18.

The second support member 42 has a base plate 47 located at the most base end side of the leg member main body 22, and a load support member 48 located at the tip end side of the base plate 47. The base plate 47 has a substantially disc shape having substantially the same outer diameter as the first support member 41, and the load support member 48 has a substantially cylindrical shape located at the center of the base plate 47 and having an outer diameter smaller than that of the base plate 47. The tip surface of the second support member 42, that is, a tip surface 48A of the load support member 48, is provided with the spike receiving member 49 that is one step concave from the surroundings. Through holes 47A are formed in the base plate 47 to allow the screw members 43A to 43C to pass through. The through holes 47A are arranged so as to be aligned with the positions of the second female screw holes 44 of the first support member 41.

The spike receiving member 49 is a notch cut out in a conical shape having a wider apex angle than the spike member 35 of the first support member 41, and comes into contact with the vicinity of the apex of the spike member 35 to support the load from the first support member 41, the support column 23, and the housing 11. The load support member 48 has a flange member 48B that projects outward from the periphery of the spike receiving member 49. The flange member 48B is formed so that its outer diameter and shaft length are smaller than the inner diameter and shaft length of the small-diameter part 46B of the notch 46. The shape of the spike member 35 is not limited to the above, and may be a triangular pyramid shape, a hemispherical shape, or the like, and the spike receiving member 49 may be a notch that matches the shape of the spike member 35.

Figure 8:
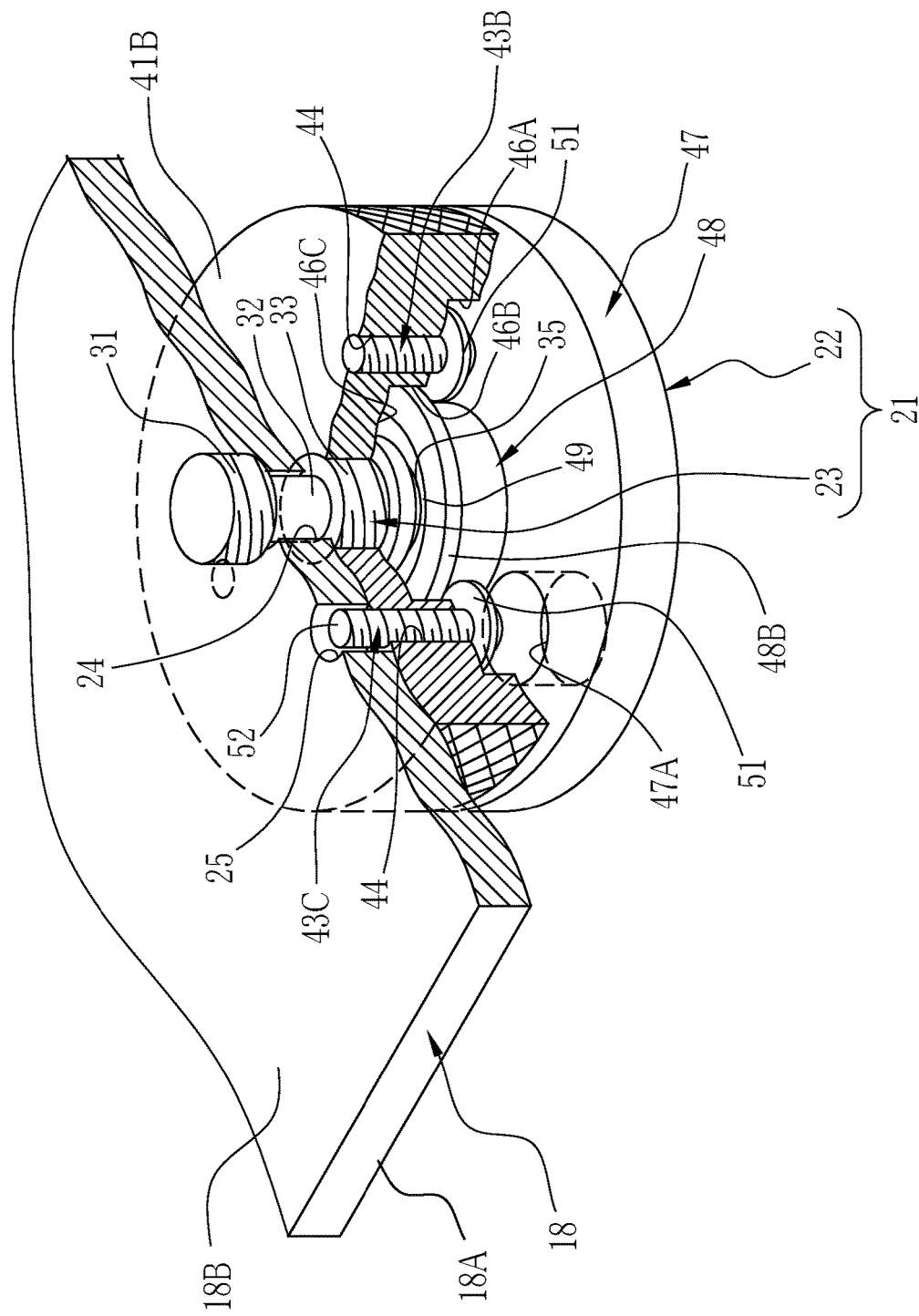
FIG. 8 is a perspective view in which a part is cut out around the leg member of the electronic apparatus.
Figure 9:
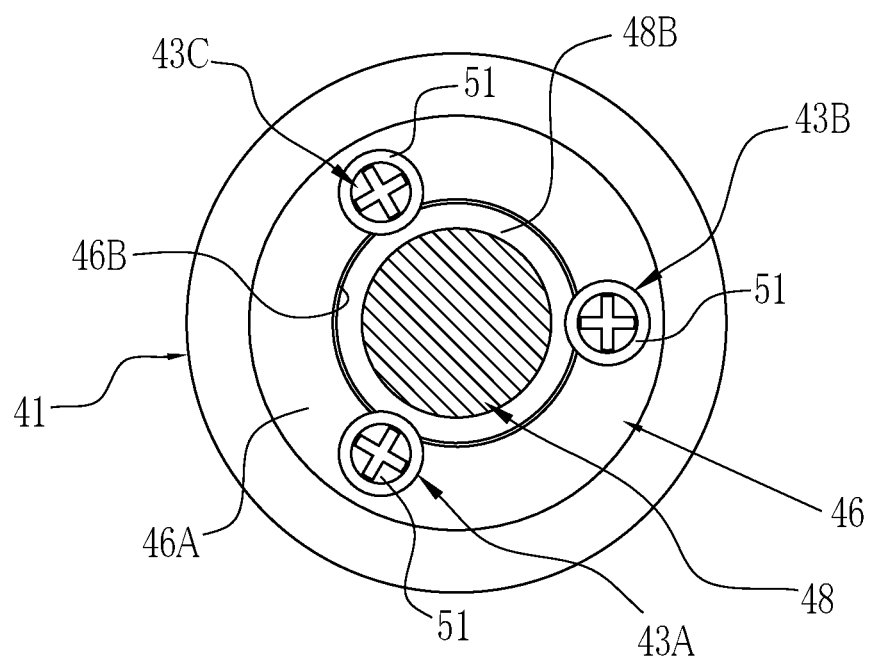
FIG. 9 is a cross-sectional view of a main part along the line IX-IX of FIG. 4.

As shown in FIG. 8, when the spike receiving member 49 and the spike member 35 are in contact with each other, the flange member 48B has entered the inside of the small-diameter part 46B, and the second female screw hole 44 and the flange member 48B are in close proximity to each other. Therefore, as shown in FIG. 9, when the second female screw holes 44 and the screw members 43A to 43C are screwed together, screw heads 51 of the screw members 43A to 43C can lock the flange member 48B.

By screwing the second female screw holes 44 and the screw members 43A to 43C, the flange member 48B is movable inside the small-diameter part 46B, but is regulated in the axis direction and the diameter direction by the inner peripheral surface of the small-diameter part 46B, the upper end 46C (see FIG. 7C) and the screw heads 51. Therefore, since the relative positions of the first support member 41 and the second support member 42 are regulated, it is possible to prevent the first support member 41 and the second support member 42 from being separated from each other.

Of the screw members 43A to 43C, at least the screw member 43C is formed longer than the other screw members 43A and 43B. As a result, when the screw member 43C is screwed into the second female screw hole 44, only a tip part 52 of the screw member 43C protrudes from the top surface 41B of the first support member 41. The outer diameter of the tip part 52 is smaller than the inner diameter of the through hole 25. Then, the tip part 52 of the screw member 43C protruding from the top surface 41B, as a projecting pin, is loosely fitted with the through hole 25 of the bottom plate 18 (states shown in FIGS. 3 and 8). As a result, the leg member 21 is restricted from rotating around the shaft member 32. Therefore, the leg member 21 does not rotate in the opposite direction to that when the first male screw member 31 is screwed into the first female screw hole 24.

Figure 10A:
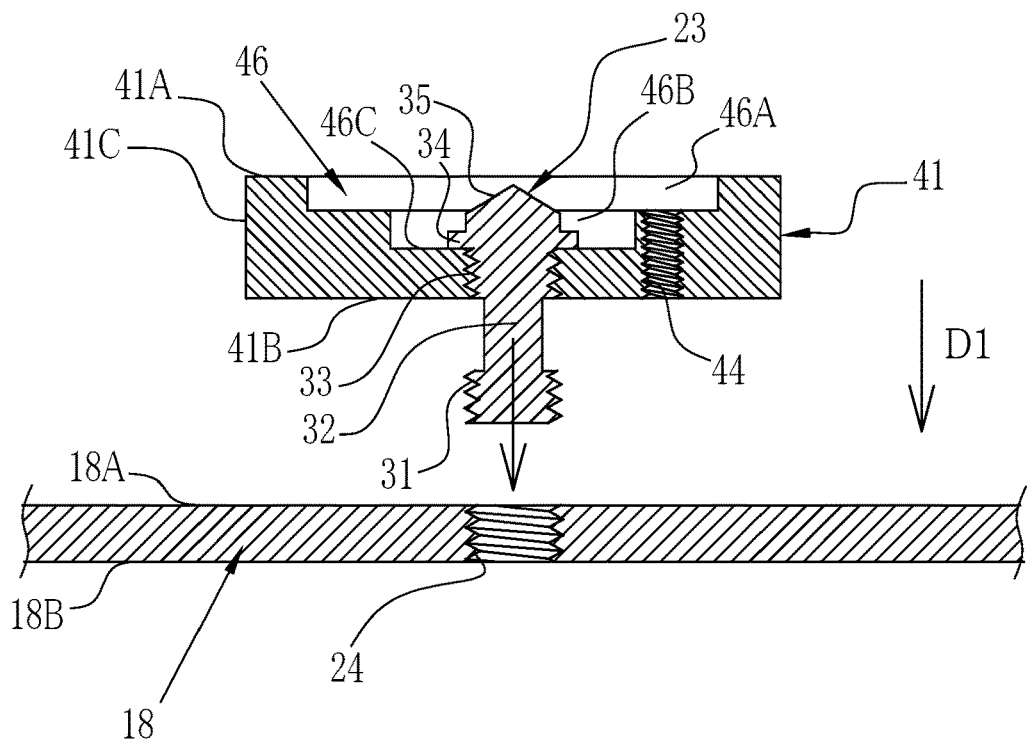
FIGS. 10A and 10B are explanatory diagrams illustrating a process of inserting a first male screw member into a first female screw hole.
Figure 10B:
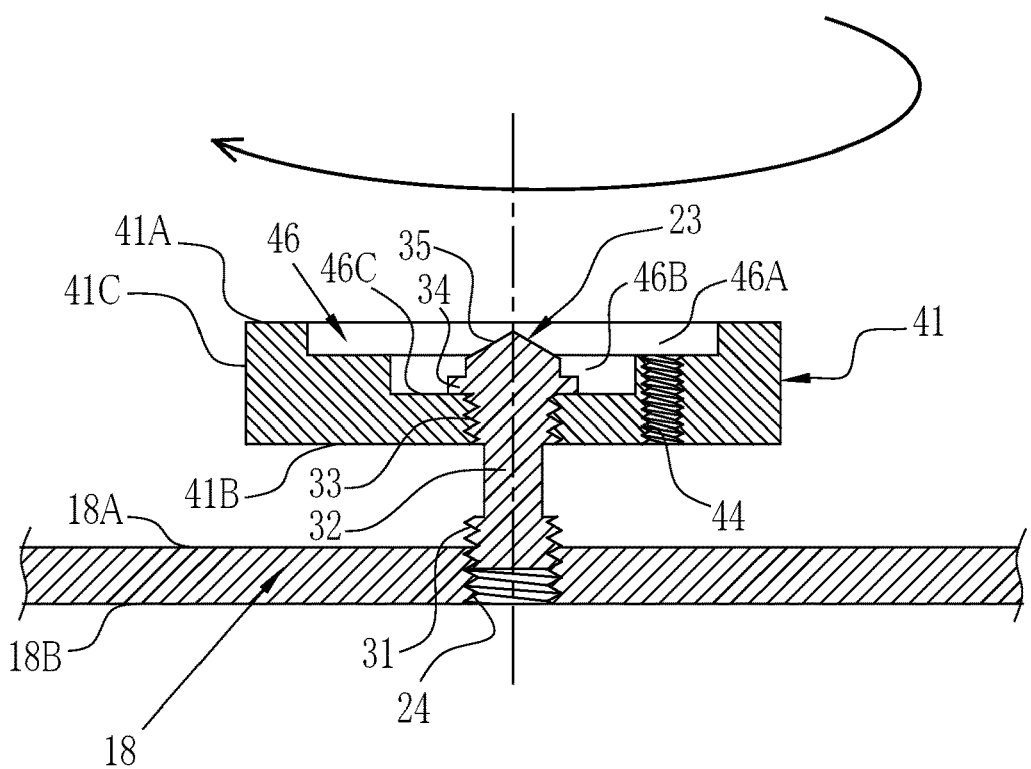

Next, a process of attaching the leg member 21 having the above configuration to the bottom plate 18 of the housing 11 will be described with reference to FIGS. 10A to 15B. As shown in FIG. 10A, an operator sets, for example, the bottom plate 18, the first support member 41, and the support column 23 in an upside down state. At this time, the first support member 41 and the support column 23 are already in a combined state. Then, as shown in FIG. 10B, the first male screw member 31 is rotated in the rotational direction in which the first male screw member 31 advances in the direction D1, and the first male screw member 31 is screwed into the first female screw hole 24.

Figure 11A:
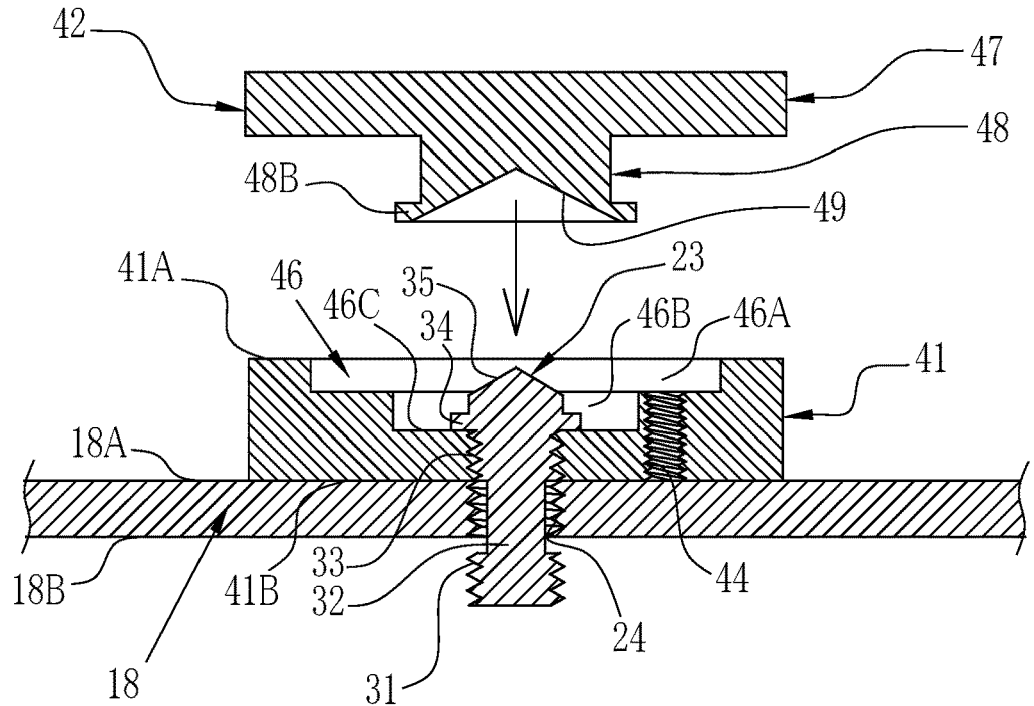
FIGS. 11A and 11B are explanatory diagrams illustrating a process of aligning a recess of a spike receiving member with a position of a spike member.
Figure 11B:
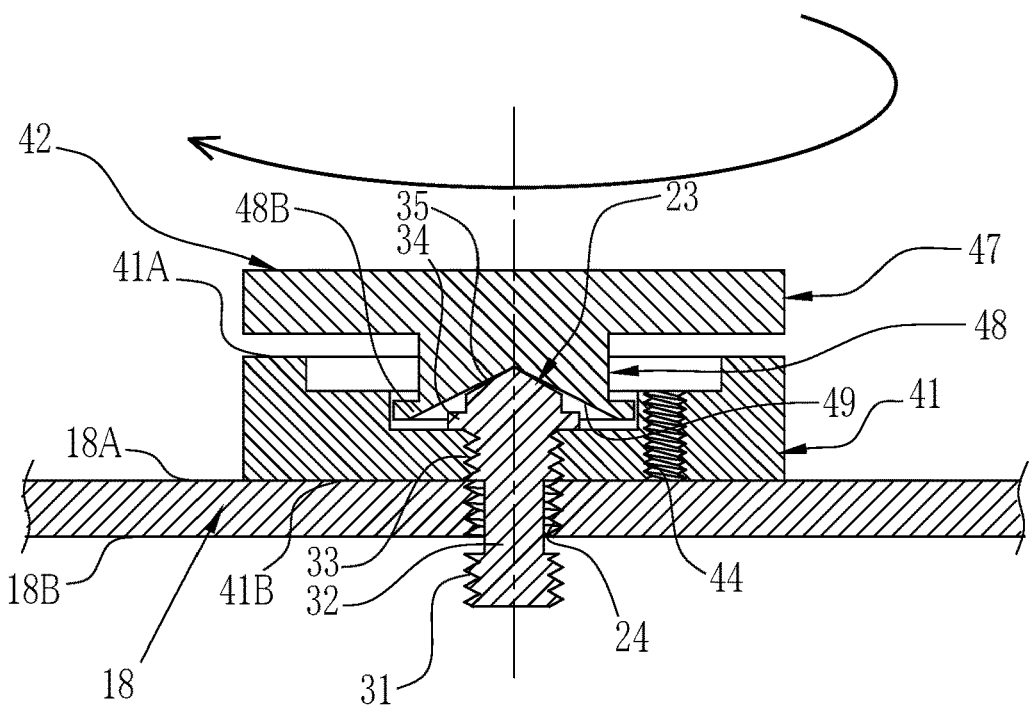

As shown in FIG. 11A, when the first male screw member 31 passes from the bottom surface 18A side to the top surface 18B surface side by screwing the first male screw member 31 into the first female screw hole 24, the shaft member 32 becomes in a state of being loosely fitted in the first female screw hole 24. Next, the operator prepares the second support member 42. As shown in FIG. 11B, the second support member 42 is placed on the first support member 41 by aligning the concave portion of the spike receiving member 49 with the convex position of the spike member 35.

Figure 12A:
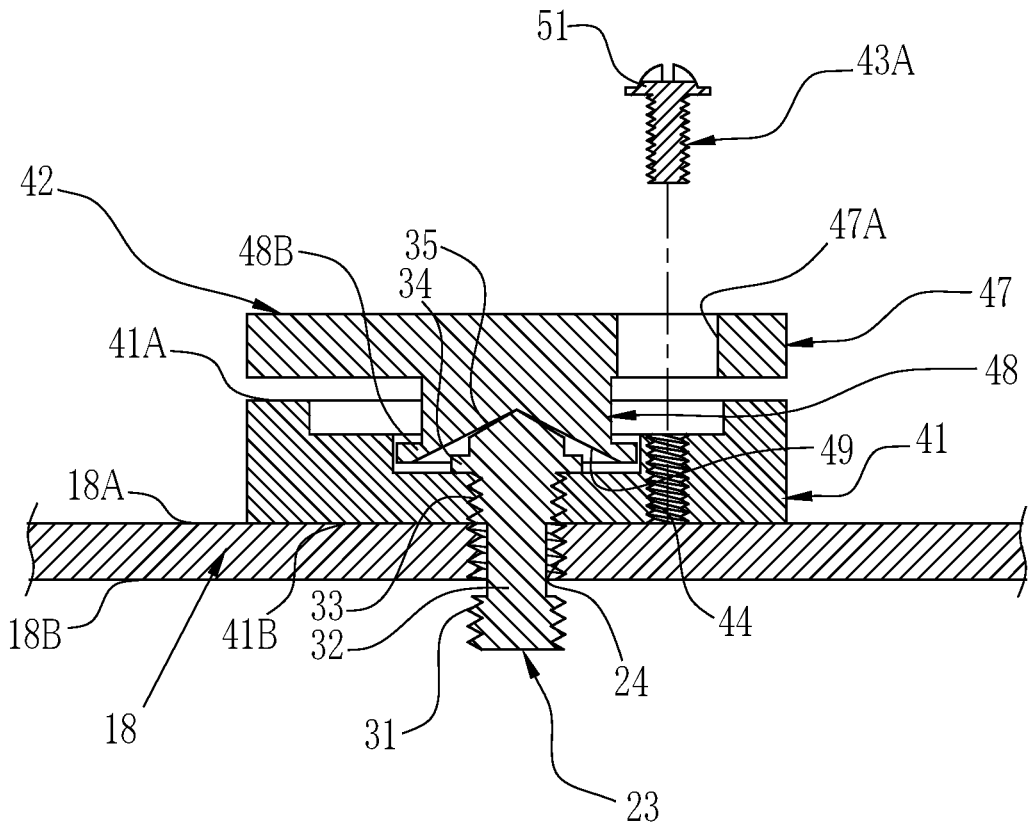
FIGS. 12A and 12B are explanatory diagrams illustrating a process of screwing a shorter screw member into a second female screw hole.
Figure 12B:
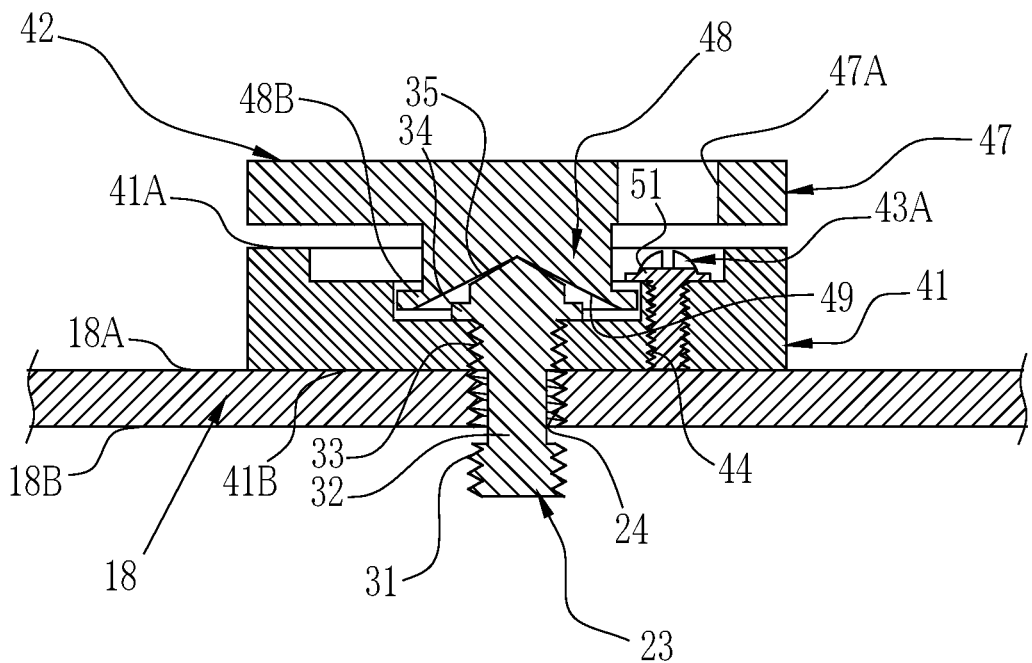

Next, the second support member 42 is rotated around the spike receiving member 49 so that the position of the through hole 47A is aligned with the position of the second female screw hole 44 as shown in FIG. 12A. Of the screw members 43A to 43C, the shorter screw member 43A is used first. Then, the screw member 43A is inserted inside the second support member 42 through the through hole 47A. The screw member 43A is screwed into the second female screw hole 44 with use of a jig such as a screwdriver. As shown in FIG. 12B, the screw head 51 becomes in a state of locking the flange member 48B.

Figure 13A:
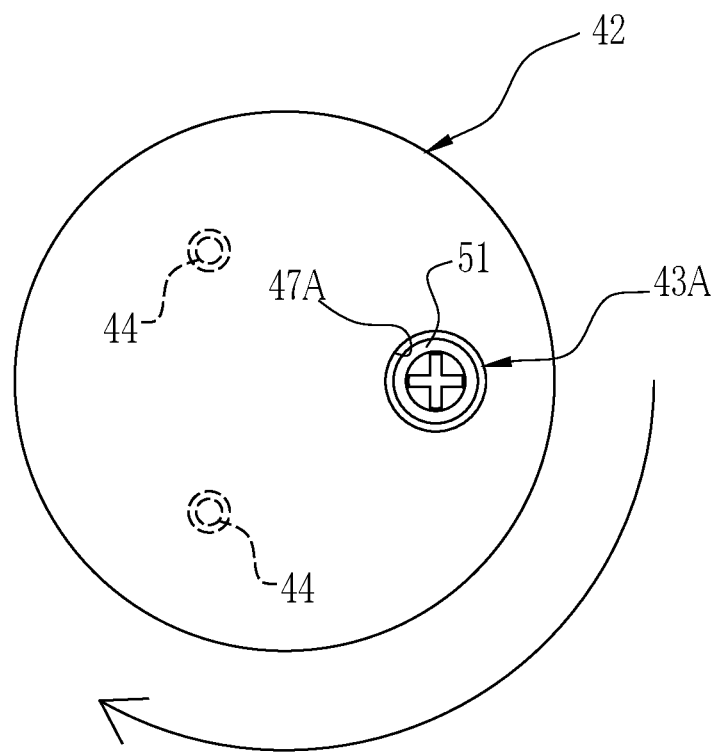
FIGS. 13A and 13B are explanatory diagrams illustrating a process of aligning a through hole with a position of a second female screw hole by rotating a second support member.
Figure 13B:
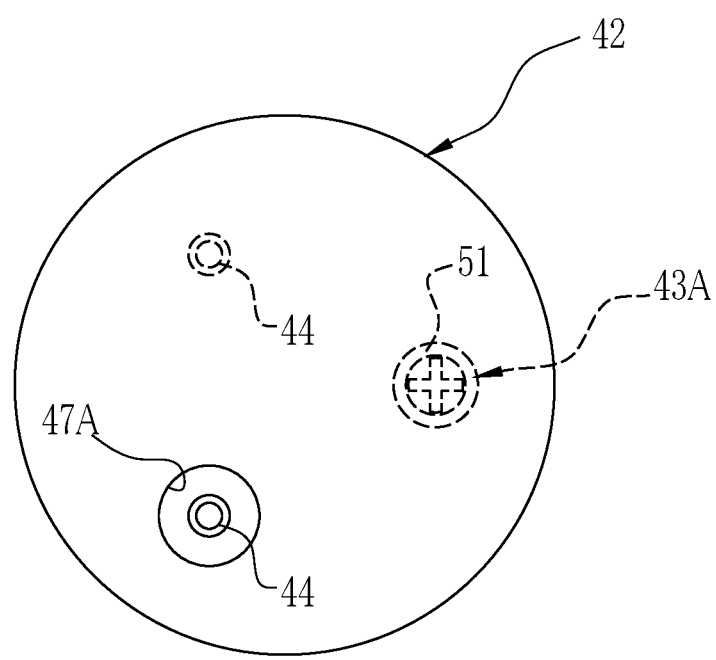

After screwing the screw member 43A into the second female screw hole 44, as shown in FIG. 13A, the second support member 42 is rotated around the spike receiving member 49. As shown in FIG. 13B, the position of the through hole 47A is aligned with the position of the second female screw hole 44 different from the second female screw hole 44 into which the screw member 43A has already been screwed. The second screw member used is also the shorter screw member 43B so that after screwing this into the second female screw hole 44, the first support member 41 and the second support member 42 can be rotated. Note that FIGS. 13A to 14B are views of the second support member 42 as viewed from the base end side.

Figure 14A:
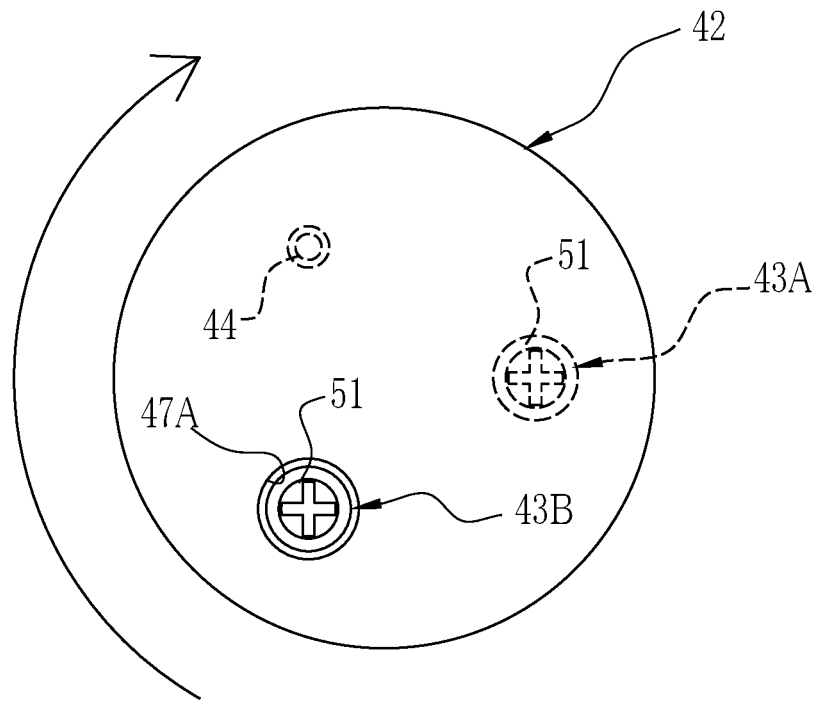
FIGS. 14A and 14B are explanatory diagrams illustrating a process of aligning a through hole with a position of another second female screw hole by rotating the second support member.

As shown in FIG. 14A, the screw member 43B is inserted into the through hole 47A and screwed into the second female screw hole 44 in the same manner as the screw member 43A. And the screw head 51 locks the flange member 48B in the same manner as the screw member 43A.

Figure 14B:
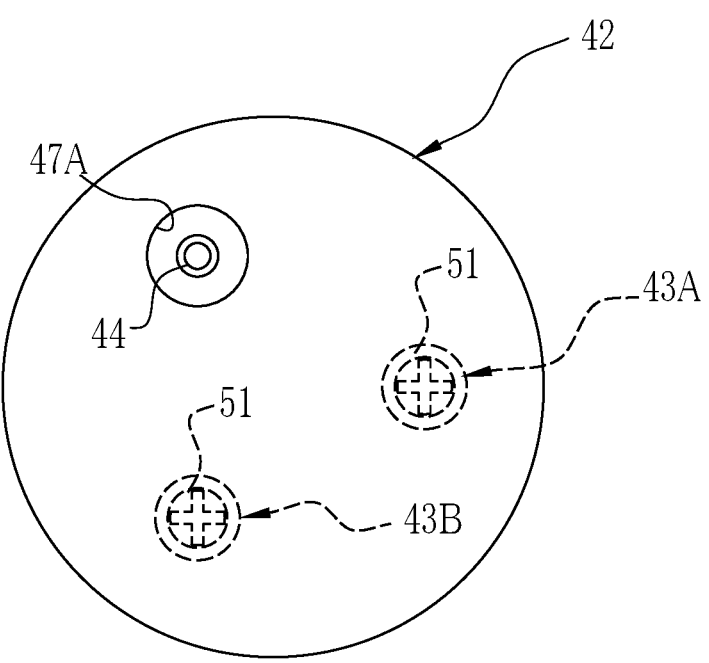
Figure 15A:
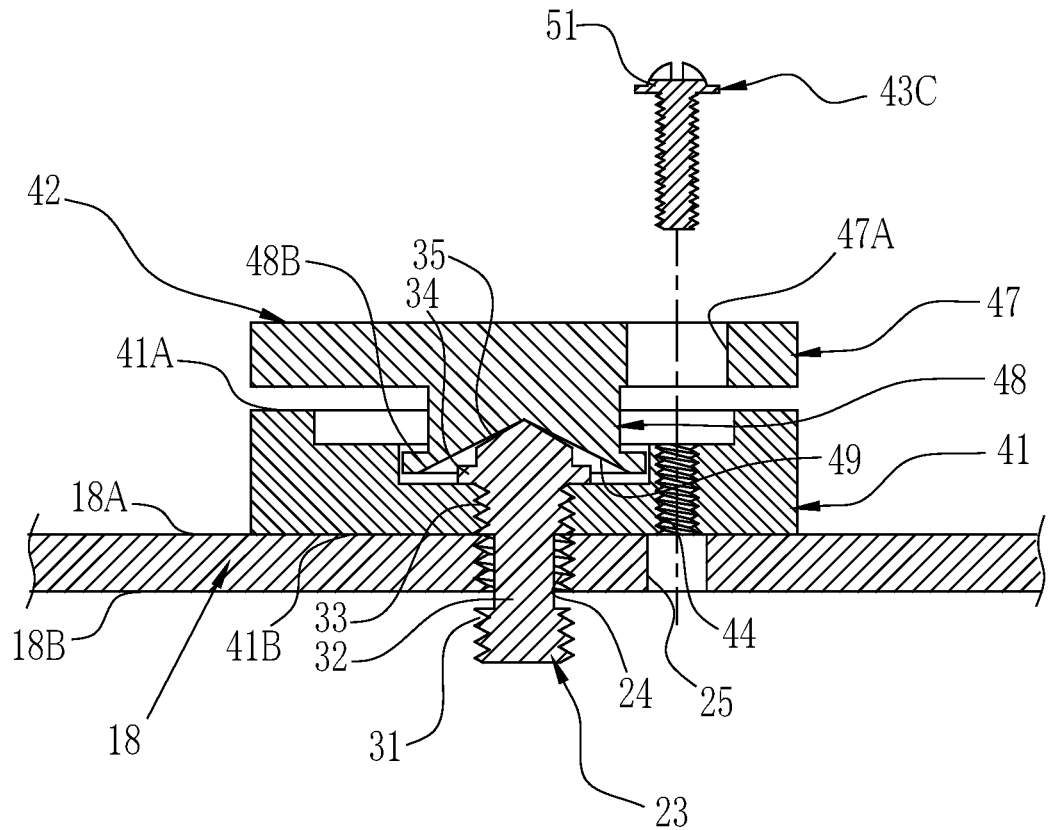
FIGS. 15A and 15B are explanatory diagrams illustrating a process of aligning a position of a second female screw hole with a position of a through hole by rotating the first support member and the second support member, and then screwing a longer screw member into the second female screw hole.
Figure 15B:
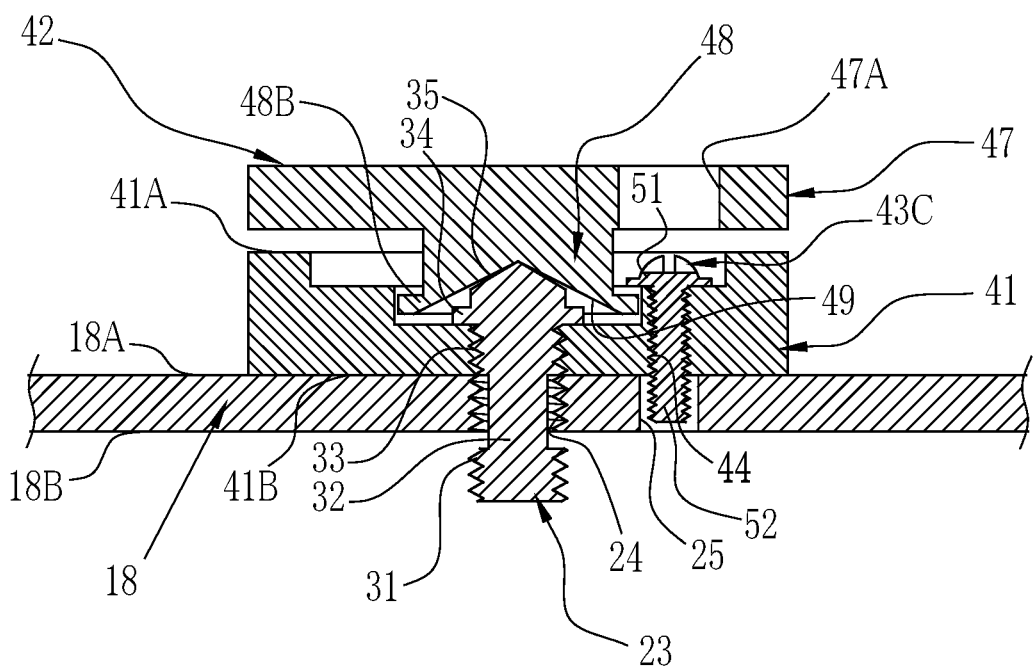

Then, the second support member 42 is rotated around the spike receiving member 49, and the first support member 41 is rotated around the shaft member 32, to perform alignment. That is, as shown in FIG. 14B, the position of the through hole 47A is aligned with the position of the remaining second female screw hole 44 in which the screw member 43C has not yet been screwed. And as shown in FIG. 15A, the positions of the second female screw hole 44 and the through hole 47A are aligned with the position of the through hole 25 of the bottom plate 18. Then, the longer screw member 43C to be used last is inserted inside the second support member 42 through the through hole 47A. The screw member 43C is screwed into the second female screw hole 44 with use of a jig such as a screwdriver. And the screw head 51 locks the flange member 48B in the same manner as the screw members 43A and 43B. This prevents the first support member 41 and the second support member 42 from separating from each other, as described above.

Only the tip part 52 of the screw member 43C protrudes from the top surface 41B of the first support member 41. The tip part 52 is loosely fitted with the through hole 25 as the projecting pin. As a result, the leg member 21 does not rotate in the direction opposite to that when the first male screw member 31 is screwed into the first female screw hole 24. Therefore, it is possible to prevent the leg member 21 from detaching from the bottom plate 18. When turned upside down, the leg member 21 is in a state of being attached to the bottom plate 18 as shown in FIGS. 3 and 4.

Next, the effects of the above configuration will be described. When the leg member 21 is attached to the housing 11 by the mounting structure described above, the leg member 21 does not come off from the housing 11 while maintaining the state in which the shaft member 32 is loosely fitted to the housing 11. Therefore, when installing the electronic apparatus 10, the operator can install the leg member 21 in a state of being integrally attached to the housing 11, so that the installation work can be easily performed. Then, since the electronic apparatus 10 can be installed in a state where the housing 11 and the leg member 21 are loosely fitted, the leg member main body 22 has a function as an insulator. Therefore, it is possible to suppress the vibration from being transmitted to the inside of the housing 11. If the housing and the leg member are fixed, the leg member is particularly likely to transmit the external vibration received from the floor surface to the housing. However, in the present embodiment, since the shaft member 32 is installed in a loosely fitted state, this does not occur.

Further, when the leg member 21 is attached to the housing 11, since a retaining member to be attached to the tip end portion of the support column 23 is not required, the degree of freedom in arranging the parts inside the housing 11 is improved. If the retaining member such as an E-ring or a snap pin is attached to the tip end portion of the support column 23, it may not be possible to place electrical components around the support column 23. This is to prevent the retaining member from coming into contact with the electric component and receiving an electric current. Since the retaining member is not used in the mounting structure and the electronic apparatus 10 having the above configuration, such a problem can be avoided. Further, since it is not necessary to process a groove or a hole for mounting the retaining member in the support column 23, it is possible to prevent an increase in the manufacturing process.

Further, in the present embodiment, since the tip part of the screw member 43C as the projecting pin loosely fits with the through hole 25 of the bottom plate 18 to regulate the rotation of the leg member 21, it is possible to prevent the leg member 21 from detaching from the bottom plate 18. As a result, the leg member 21 and the housing 11 are further integrated, and the leg member 21 does not come off from the housing 11.

Further, the leg member main body 22 is composed of the first support member 41 and the second support member 42, and the spike member 35 on the first support member 41 side is received by the spike receiving member 49 on the second support member 42 side. Accordingly, the contact area between the first support member 41 and the second support member 42 can be reduced. As a result, the vibration transmitted to the inside of the housing 11 can be further suppressed.

Figure 16:
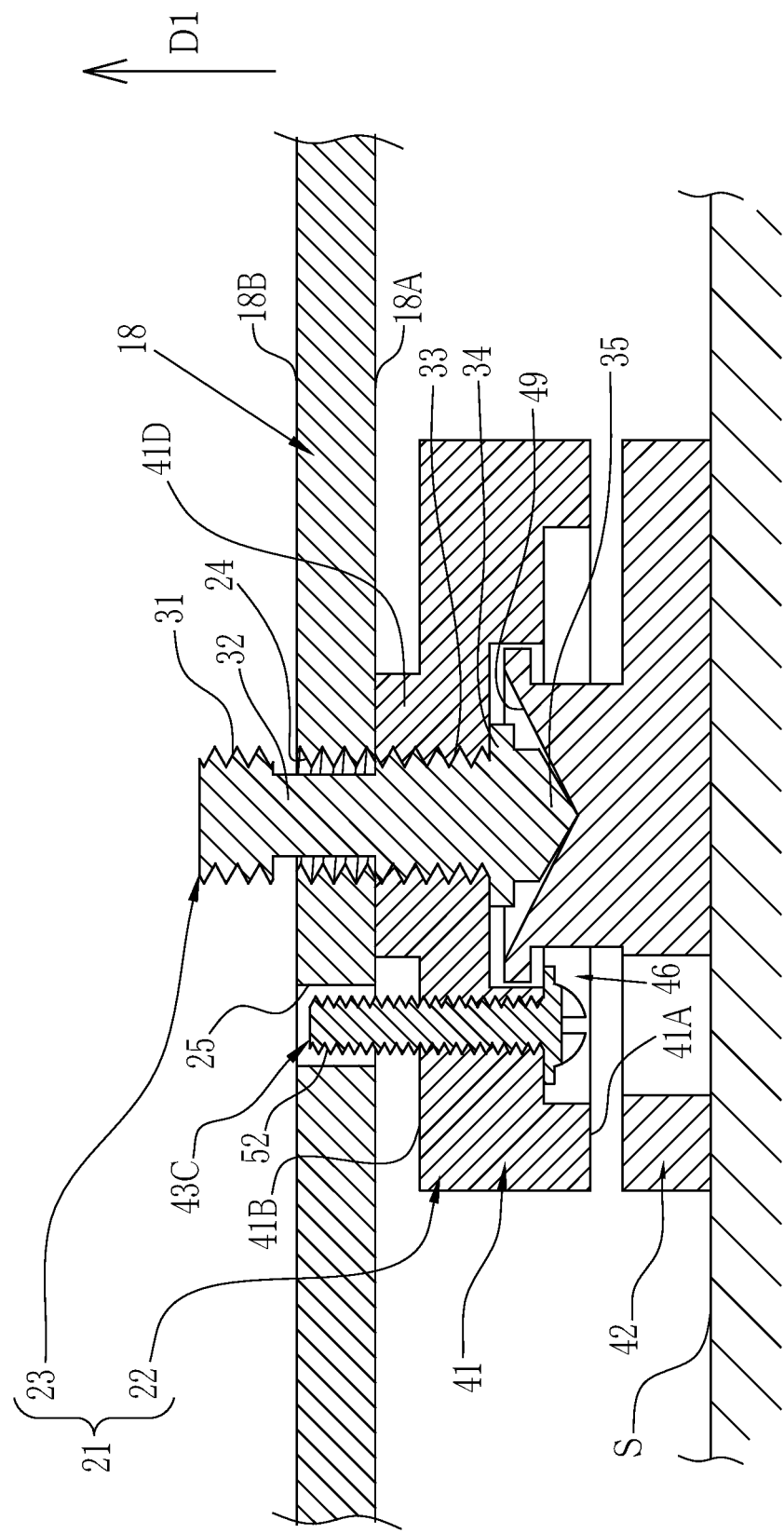
FIG. 16 is a cross-sectional view showing a modified example having a load support member.

In the above embodiment, the entire top surface 41B of the leg member main body 22 is in contact with the bottom plate 18 of the housing 11. However, in a modified example shown in FIG. 16, the first support member 41 has a housing supporting member 41D protruding from the top surface 41B. The housing supporting member 41D is a columnar protrusion having an outer diameter smaller than that of the top surface 41B, and is integrally formed. The housing supporting member 41D contacts the bottom plate 18 and supports the load of the housing 11. Since the contact area between the bottom plate 18 and the leg member main body 22 is reduced, the vibration transmitted to the inside of the housing 11 can be further suppressed. The shape of the housing supporting member 41D is not limited to this, and may be any shape such as a cone, a hemisphere, a triangular pyramid, or a cylinder as long as the contact area is smaller than that of a simple plane.

Figure 17:
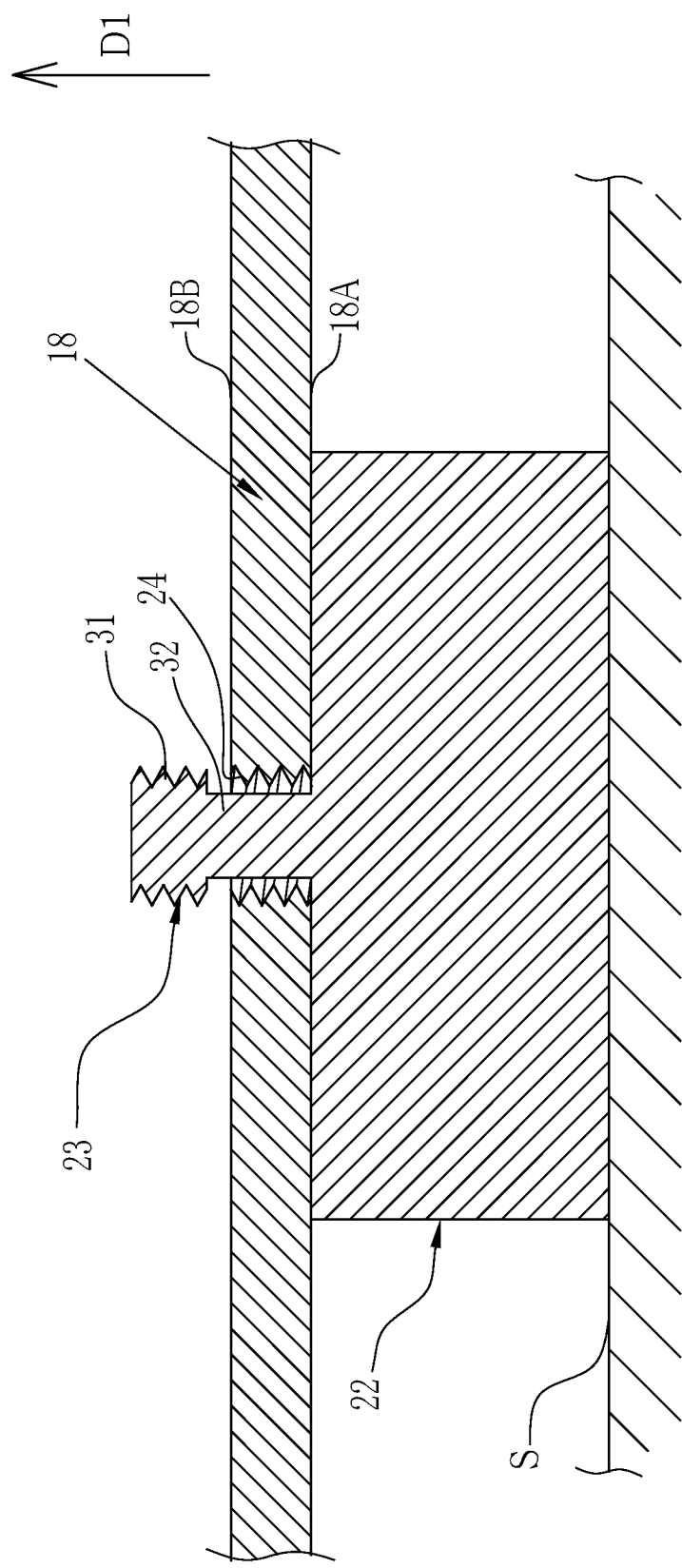
FIG. 17 is a cross-sectional view showing a modified example in which a leg member main body and the support column are integrally provided.

As another modification of the above embodiment, as shown in FIG. 17, the leg member main body 22 may be composed of one component, and the leg member main body 22 and the support column 23 may be integrally provided. The support column 23 has the first male screw member 31 and the shaft member 32, as in the above embodiment. Therefore, as in the first embodiment, the shaft member 32 is kept loosely fitted to the housing 11 and does not come off from the housing 11. On the other hand, the number of parts of the leg member main body 22 and the support column 23 can be reduced, and the manufacturing process can be reduced.

In the above embodiment, the digital audio data reproduction equipment is illustrated as the electronic apparatus to which the leg member is attached using the mounting structure described above. However, the present invention is not limited to this, and can be applied to various electronic apparatuses such as audio equipment and personal computers equipped with motors to rotate fans and discs, speakers equipped with diaphragms to emit sound, amplifiers to amplify sound, and other devices equipped with an oscillator for generating a master clock or a power transformer that converts voltage using electromagnetic induction. Further, in the above embodiment, the support column and the leg member main body are formed of metal, but the present invention is not limited to this, and for example, they may be formed of resin.

The present invention is not limited to the above-described embodiment, and various changes and modifications should be construed as included therein, as long as these are not deviated from the scope of the present invention.

EXPLANATION OF REFERENCES

10: electronic apparatus
11: housing
12: power button
13: indicator
14: medium insertion port
15: top plate
16: front plate
17: side plate
18: bottom plate
18A: bottom surface
18B: top surface
21: leg member
22: leg member main body
23: support column
24: first female screw hole
25: through hole
31: first male screw member
32: shaft member
33: second male screw member
34: disc member
35: spike member
41: first support member
41A: bottom surface
41B: top surface
41C: outer peripheral surface
41D: housing supporting member
42: second support member
43A, 43B, 43C: screw member
44: second female screw hole
45: third female screw hole
46: notch
46A: large-diameter part
46B: small-diameter part
46C: upper end
47: base plate
47A: through hole
48: load support member
48A: tip surface
48B: flange member
49: spike receiving member
51: screw head
52: tip part
D1: direction
LA: shaft length
LO1, LO2, LO3: length
RA: outer diameter
RD: outer diameter
RI: inner diameter
RO1: outer diameter
RO2: outer diameter
S: installation surface
T: thickness

What is claimed is:

1. A mounting structure of a leg member to be attached to a housing of an electronic apparatus, the structure comprising:
    a bottom plate which constitutes the housing and has a plurality of first female screw holes; and
    the leg member including:
        a leg member main body placed between the bottom plate and an installation surface of the electronic apparatus; and
        a support column provided integrally with the leg member main body, the support column including:
            a first male screw member located at a tip end of the support column, screwed into one of the plurality of first female screw holes, and being formed so that an outer diameter of the first male screw member is larger than an inner diameter of the one of the plurality of first female screw holes; and
            a shaft member that connects the leg member main body and the first male screw member, the shaft member being formed so that an outer diameter of the shaft member is smaller than the inner diameter of the one of the plurality of first female screw holes and a length of the shaft member is equal to or larger than a thickness of the bottom plate, and being loosely fitted with the one of the plurality of first female screw holes,
    wherein in a case where the first male screw member is screwed into the one of the plurality of first female screw holes and passes from a first side to a second side of the bottom plate, the shaft member is loosely fitted into the one of the plurality of first female screw holes, and the first male screw member is locked to a surface on the second side of the bottom plate.

2. The mounting structure of the leg member according to claim 1, wherein
    the leg member main body includes a first support member connected to the shaft member and a second support member located on a base end side of the first support member,
    the first support member has a spike member that protrudes from a base end portion of the first support member and is one step convex with respect to its surroundings,
    the second support member has a spike receiving member that is on the tip surface of the second support member and is one step concave with respect to its surroundings, and
    the second support member supports load from the first support member, the support column, and the housing by contacting the spike receiving member with the spike member.

3. The mounting structure of the leg member according to claim 2, wherein
    the first support member has a plurality of second female screw holes,
    the leg member main body includes a plurality of screw members to be screwed into the second female screw holes,
    the second support member has a flange member that projects outward from a periphery of the spike receiving member, and
    the first support member and the second support member are prevented from being separated from each other, by locking the flange member with the screw members screwed into the second female screw holes.

4. The mounting structure of the leg member according to claim 3, wherein
- the leg member main body has a projecting pin protruding from a tip surface facing the bottom plate, and
- the leg member is restricted from rotating around the shaft member, by loosely fitting the projection pin with a through hole formed in the bottom plate.

5. The mounting structure of the leg member according to claim 4, wherein
- the projecting pin is at least one of the plurality of screw members, and a tip part of the screw member, which is screwed with the first support member and protrudes from the tip end of the leg member main body, is loosely fitted in the through hole as the projecting pin.

6. The mounting structure of the leg member according to claim 2, wherein
- the spike member has any one of a conical shape, a triangular pyramid shape, and a hemispherical shape, and
- the spike receiving member is a notch cut out from the tip surface of the second support member according to the shape of the spike member.

7. The mounting structure of the leg member according to claim 1, wherein
- the leg member main body has a projecting pin protruding from a tip surface facing the bottom plate, and
- the leg member is restricted from rotating around the shaft member, by loosely fitting the projection pin with a through hole formed in the bottom plate.

8. The mounting structure of the leg member according to claim 1, wherein
- the leg member main body has a housing supporting member protruding from a tip surface facing the bottom plate, and
- the housing supporting member comes into contact with the bottom plate to support load from the housing.

9. The mounting structure of the leg member according to claim 1, further comprising the electronic apparatus, wherein the leg member is attached to the housing of the electronic apparatus.

10. The mounting structure of the leg member according to claim 1, wherein
- the support column further includes a second male screw member located at an end of the support column that is opposite the tip end of the support column,
- the shaft member is disposed between the first male screw member and the second male screw member,
- the outer diameter of the shaft member is smaller than an outer diameter of the first male screw member and an outer diameter of the second male screw member,
- the leg member main body has a first female screw hole, and
- the second male screw member is disposed within and locked to the first female screw hole of the leg member main body.

* * * * *